United States Patent
Kohno

(10) Patent No.: US 6,806,731 B2
(45) Date of Patent: Oct. 19, 2004

(54) SEMICONDUCTOR INTEGRATED CIRCUIT DEVICE AND FAULT-DETECTING METHOD OF A SEMICONDUCTOR INTEGRATED CIRCUIT DEVICE

(75) Inventor: Ichiro Kohno, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/143,880

(22) Filed: May 14, 2002

(65) Prior Publication Data

US 2002/0175699 A1 Nov. 28, 2002

(30) Foreign Application Priority Data

May 22, 2001 (JP) ........................................ 2001-151983

(51) Int. Cl.[7] .............................................. G01R 31/28
(52) U.S. Cl. ........................... 326/38; 326/46; 327/202; 714/726
(58) Field of Search ..................... 326/38, 46; 327/202, 327/212; 714/726

(56) References Cited

U.S. PATENT DOCUMENTS 5,606,565 A * 2/1997 Edler et al. ................. 371/22.3
6,185,709 B1 * 2/2001 Dreibelbis et al. .......... 714/726

OTHER PUBLICATIONS

Kwang–Ting Cheng and Angela Kristic, "Current Directions in Automatic Test–Pattern Generation", IEEE, Nov. 1999, pp. 58–64.

Yervant Zorian, "A Distributed BIST Control Scheme for Complex VLSI Devices", IEEE 1993, pp. 4–9.

Benoit Nadeau–Dostie, "Design for AT–SPEED Test, Diagnosis and Measurement", Chapter 1 Technology Overview, pp. 22–25, Sep. 1999.

* cited by examiner

Primary Examiner—Daniel D. Chang
(74) Attorney, Agent, or Firm—Reed Smith LLP; Stanley P. Fisher, Esq.; Juan Carlos A. Marquez, Esq.

(57) ABSTRACT

A semiconductor integrated circuit device which shortens the time required for testing a divided logic circuit to reduce test cost and a fault-detecting method therefor. The logic circuit is divided into N logic blocks using N+1 scan paths comprises of scan flip-flops each having selectors for selectively picking up the output signals of storage elements which are fed back to the storage elements. A common scan operation may then be carried out on these logic blocks (Logic 1-to Logic N), and a testing operation may be continuously carried out on the logic blocks. The present invention preferably eliminates the overlaps in conventional scan operations, resulting in a shorter test time.

5 Claims, 19 Drawing Sheets

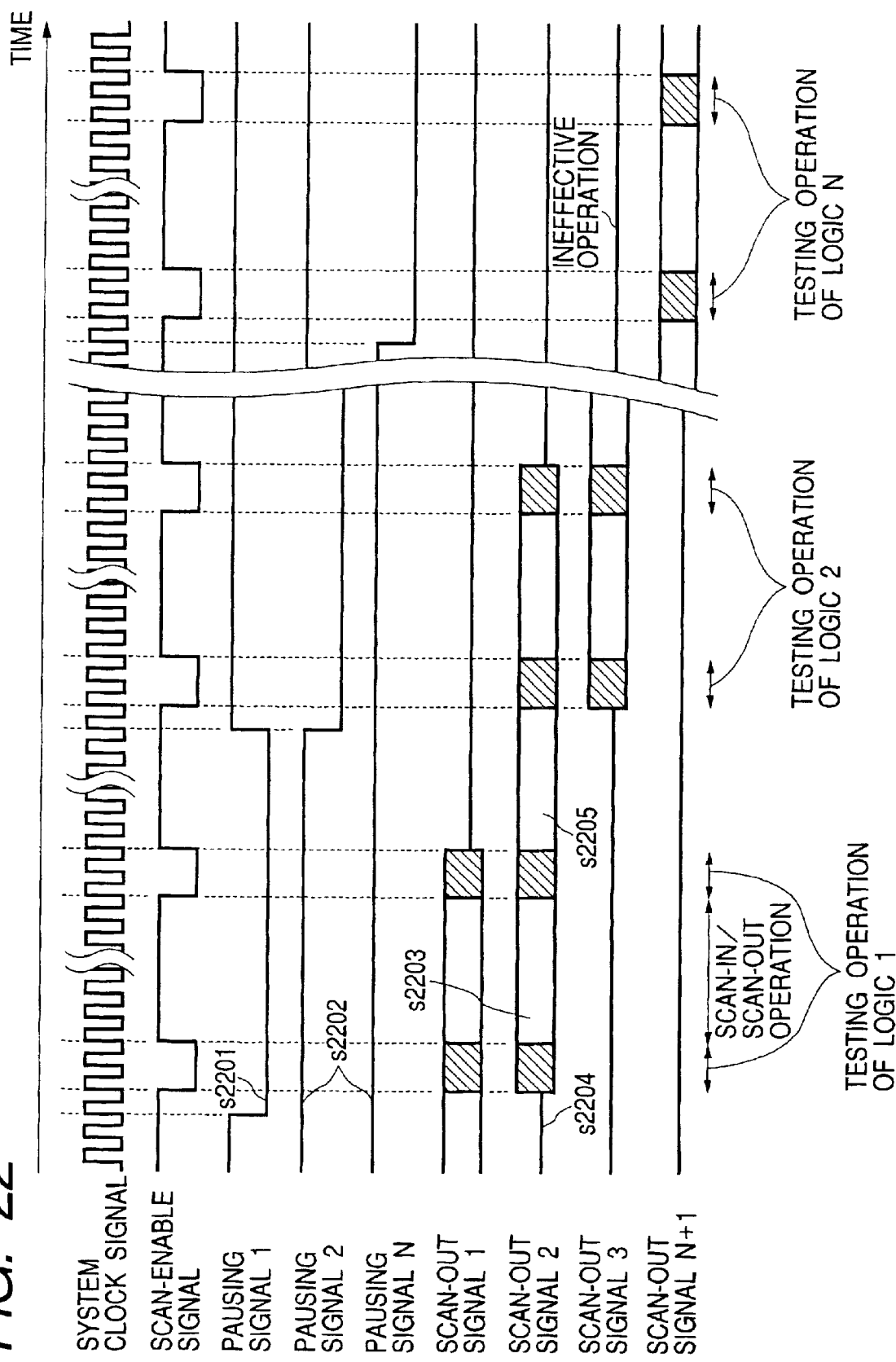

US 6,806,731 B2

SEMICONDUCTOR INTEGRATED CIRCUIT DEVICE AND FAULT-DETECTING METHOD OF A SEMICONDUCTOR INTEGRATED CIRCUIT DEVICE

CLAIM OF PRIORITY

This application claims priority to Japanese Patent Application No. 2001-151983 filed on May 22, 2001.

BACKGROUND OF THE INVENTION

1. Field of the Invention

The present invention relates to a semiconductor integrated circuit device, and, more particularly, the present invention relates to a semiconductor circuit device which has a logic circuit including storage elements and a fault-detecting method of a semiconductor integrated circuit device.

2. Description of the Background

A conventional method for scanning a logical circuit has been widely used to detect faults, such as a stuck-at fault, in a logic circuit. This conventional method can efficiently detect faults because the value of a flip-flop (hereinafter, "FF") can be directly handled using this method.

The process for detecting a fault (hereinafter, "testing") of a scanned logic circuit will now be explained with reference to the accompanying drawings.

FIG. 17 is a circuit diagram showing a scan FF as used in the prior art. This example is a scan FF with a multiplexer (hereinafter, "MUX"), or a MUX-type scan flip-flop (FF).

In this configuration, MUX g1702 is connected with input terminal D of a master latch g1701 constituting a FF. A signal (hereinafter, "input signal from logic circuit") which comes from logic gates (hereinafter, "user logic circuit") for normal operation at the preceding stage is input through an input signal line into g1702. Also, a signal for scan from the FF at the preceding stage (hereinafter, "scan-in signal") is input through a scan-in signal line. Further, a control signal for selecting whether g1701 picks up the input signal from logic circuit or the scan-in signal (hereinafter, "scan-enable signal") is input through a scan-enable signal line. Input terminal D of a slave latch g1703 is connected with output terminal Q of g1701. The output terminal of g1703 is connected with an output signal line which conveys a signal (hereinafter, "output signal") to the user logic circuit or a scan FF in a successive stage.

FIG. 18 shows a logic circuit which is scanned using the prior art. This is an example of a scanned logic circuit in which multiple MUX-type scan FFs are connected. In this configuration, scan-out signal lines of MUX-type scan FFs g1801, g1802 are connected with the scan-in signal lines of g1802 and g1803, respectively; this constitutes a signal path (hereinafter, "path"). This path is referred to as a "scan path."

The scan-in signal line of g1801 is connected with the terminal (hereinafter, "scan-in terminal") for inputting a scan-in signal from the outside of the semiconductor integrated circuit chip while the scan-out signal line of g1803 is connected with the terminal (hereinafter, "scan-out terminal") for outputting a scan-out signal to the outside of the semiconductor integrated circuit chip (hereinafter, "chip").

A test procedure which utilizes scan FFs preferably takes place in the following sequence: (1) an operation for substituting an initial value for the test into each FF in the logic circuit ("scan-in operation"); (2) an operation for inputting the initial value from each FF into the user logic circuit and letting each FF pick up the result data for the test as an output from the user logic circuit ("testing operation"); and (3) an operation for collecting the result data from each FF ("scan-out operation"). This sequence may be repeated. In FIG. 18, a1804, a1805, and a1806 represent signal flows for scan-in operation, testing operation, and scan-out operation, respectively.

FIG. 19 is a timing diagram showing the operation of a scan FF (g1704) as used in the prior art. First, for the scan-in operation, a scan-enable signal is set at High in order to enable each FF to pick up a scan-in signal. Also, in order to substitute the initial value for a test value in each FF, a transition of the system clock signal is made more than one time (s1901) to perform shift operations through the scan path.

Next, for the testing operation, in order to enable each FF to pick up an output signal, the scan-enable signal is set at Low (s1902). Also, a transition of the system clock signal is made a first time to input the initial value for the test into the user logic circuit and a second time for the result data for the test to be picked up by each FF (s1903).

For the scan-out operation, the scan-enable signal is set at High again in order to enable each FF to output a scan-out signal (s1904). Also, for collection of the result data for the test from each FF, a shift operation is done as in the scan-in operation.

FIG. 20 is a circuit diagram showing an exemplary internal circuit of a scan FF (g1704) as used in the prior art.

However, in a scan-in operation and a scan-out operation (collectively referred to as "scan operation") the amount of state changes of the logic circuit tends to be higher than in normal user operation. Therefore, as pointed out in IEEE Computer vol.32, no.11 (p.61, 1999), with the growing tendency toward device miniaturization, fault-detecting errors due to excessive voltage drops or chip damage due to heat generation may occur.

As potential solutions to address this problem, some methods have been suggested; the Proceedings of the 11th International VLSI Test Symposium (pp.4–9, 1993) include one such method in which the logic circuit is divided into blocks which are then tested sequentially.

The way in which the logic circuit is divided into blocks and each block is tested will now be described with reference to the relevant accompanying drawings. FIG. 21 shows a logic circuit which is divided according to the prior art. In this example, the logic circuit is divided into N blocks using N+1 scan paths which consist of MUX-type scan FFs (wherein N is a natural number).

In this configuration, a selector g2102 which controls the operation of Logic 1 at the following stage is connected with the output signal line of a scan FF g2101. An output signal for normal operation and testing operation which comes from g2101 is input into g2102. In addition, a fixed signal for pausing Logic 1 is input through a boundary scan (FF) g2103. Further, a signal (pausing signal) for selecting whether to output the output signal from g2101 or the fixed signal through g2103 to Logic 1 is input through Pausing Signal Line 1. The same type of selector is connected with the output signal lines of the other scan FFs to control the operation of Logic 1 through Logic N.

FIG. 22 is a timing diagram showing the operation of the logic circuit which is divided according to the prior art. Prior to the testing operation for Logic 1, Pausing Signal 1 is set at Low so that the initial value for the test as supplied from Scan-In Signal Line 1 can be input for Logic 1 (s2201). For pausing Logic 2 to Logic N, Pausing Signal 2 to Pausing Signal N are set at High (s2202). Thereafter during the testing operation for Logic 1, the result data for the test of Logic 1 is stored in the scan FF connected with Scan-In Signal Line 2. Next, the result data for the test of Logic 1 is collected by scan operation (s2203). This is followed by similar operation sequences for Logic 2 through Logic N.

Regardless, since there are overlaps of scan operations by scan FFs in the boundaries of the divided logic circuit, this method requires a longer test time. This counteracts the advantage of scanning because the time required for scan operation generally accounts for most of the overall test time.

As exemplified in FIG. 22, although a scan operation which uses Scan-In Signal Line 2 as an input can be accomplished during the test of Logic 1 (s2204), it must be done again during the test of Logic 2 (s2205). This results in an increase in the cost required for the test (the "test cost").

As another potential solution, "Design for At-speed Test, Diagnosis and Measurement" (Kluwer Academic Publishers, p.24, 1999) suggests a method of decreasing the frequency in scan operation to reduce power consumption. In this method, the frequency (s1903) of the system clock signal in the testing operation is not decreased—only the frequency (s1901) of the system clock signal in the scan operation is decreased.

However, this method cannot reduce power consumption in the testing operation. As discussed above, the prior art has not properly addressed the problem of the extensive amount of time required for fault detection of a divided Logic circuit.

SUMMARY OF THE INVENTION

In at least one embodiment, the present invention preferably provides a semiconductor integrated circuit device in which the test cost can be reduced by reducing the required test time in relation to the prior art. The present invention also comprises fault-detecting methodologies thereof.

According to at least one preferred embodiment of the present invention, a semiconductor integrated circuit device comprises a storage element which constitutes a scan flip-flop, wherein the storage element has a selector for selectively picking up its output signals fed back thereto.

According to at least one embodiment of the present invention, a semiconductor integrated circuit device comprises storage elements and logic gates which constitute a scan flip-flop, wherein a first signal, the output signal of a first storage element, and a second signal are input into a first logic gate. The output signal of the first logic gate, and a third and a fourth signal are input into a second logic gate, and the output signal of the second logic gate and a fifth signal are input into the first storage element.

The above configuration may be characterized in that the output signal of the first storage element, the output signal of the second storage element, and the fourth signal are input into a third logic gate, and the output signal of the third Logic gate and the fifth signal are input into the second storage element. Additionally, the output signal of the first storage element and the fifth signal may be input into the second storage element.

According to at least one embodiment of the present invention, the above configuration is characterized in that the first logic gate consists of a first selector for selecting, through the first signal, whether to pick up the output signal of the first storage element or the second signal, and the second logic gate consists of a second selector for selecting, through the fourth signal, whether to pick up the output signal of the first logic gate or the third signal. Also, the embodiment may be characterized in that the third logic gate consists of a third selector for selecting, through the fourth signal, whether to pick up the output signal of the first storage element or the output signal of the second storage element.

According to another embodiment of the present invention, a semiconductor integrated circuit device comprises storage elements and logic gates which constitute a scan flip-flop, wherein: a first signal, a second signal, and a third signal are input into a first logic gate; a fourth signal and a fifth signal are input into a second logic gate; and the output signal of the first logic gate and the output signal of the second logic gate are input into the first storage element. Additionally, the output signal of the first storage element and the output signal of the second logic gate may be input into the second storage element.

According to another embodiment of the present invention, a semiconductor integrated circuit device comprises storage elements and logic gates which constitute a scan flip-flop, wherein: a first signal, a second signal, and a third signal are input into a first logic gate; a fourth signal and a fifth signal are input into a second logic gate; the output signal of the second logic gate is input into a third logic gate; and the output signal of the first logic gate and the output signal of the third logic gate are input into the first storage element. Additionally, either the fourth signal or the fifth signal, whichever makes more signal transitions than the other, is input into a gate terminal as another terminal of one of the transistors constituting the second logic gate which has a terminal connected with the output terminal of the second logic gate.

According to still another embodiment of the present invention, a semiconductor integrated circuit device comprises storage elements and logic gates which constitute a scan flip-flop, wherein: a first signal, a second signal, and a third signal are input into a first logic gate; the output signal of the first logic gate is input into a second logic gate; the output signal of the first logic gate, a fourth signal, and a fifth signal are input into a third logic gate; the output signal of the second logic gate, the fourth signal, and the fifth signal are input into a fourth logic gate; and the output signal of the third logic gate and the output signal of the fourth logic gate are input into the first storage element.

In at least one embodiment of a fault-defecting method of the present invention, the fault-detecting method of a semiconductor integrated circuit device having a logic circuit including storage elements is characterized in that the logic circuit is divided into a plurality of circuit blocks and a common scan operation is carried out on these circuit blocks. A testing operation is also carried out on every circuit block on a time-division basis.

According to another embodiment of the present invention, a fault-detecting method of a semiconductor integrated circuit device having a logic circuit including storage elements is characterized in that the logic circuit is divided into N circuit blocks using (N+1) scan paths composed of scan flip-flops, and common scan operation is carried out on these circuit blocks. A testing operation is continuously carried out on the circuit blocks.

According to still another embodiment of the present invention, a fault-detecting method of a semiconductor integrated circuit device is characterized in that the logic circuit in the semiconductor integrated circuit device is divided into N circuit blocks using (N+1) scan paths composed of scan flip-flops each having selectors for selectively picking up storage elements' output signals which are fed back to the storage elements, and a common scan operation is carried out on these circuit blocks. A testing operation is preferably continuously carried out on the circuit blocks.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 22 is a timing diagram showing the operation of the logic circuit as divided by conventional methods.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Preferred embodiments of the present invention will now be described with reference to the accompanying drawings.

Figure 1:
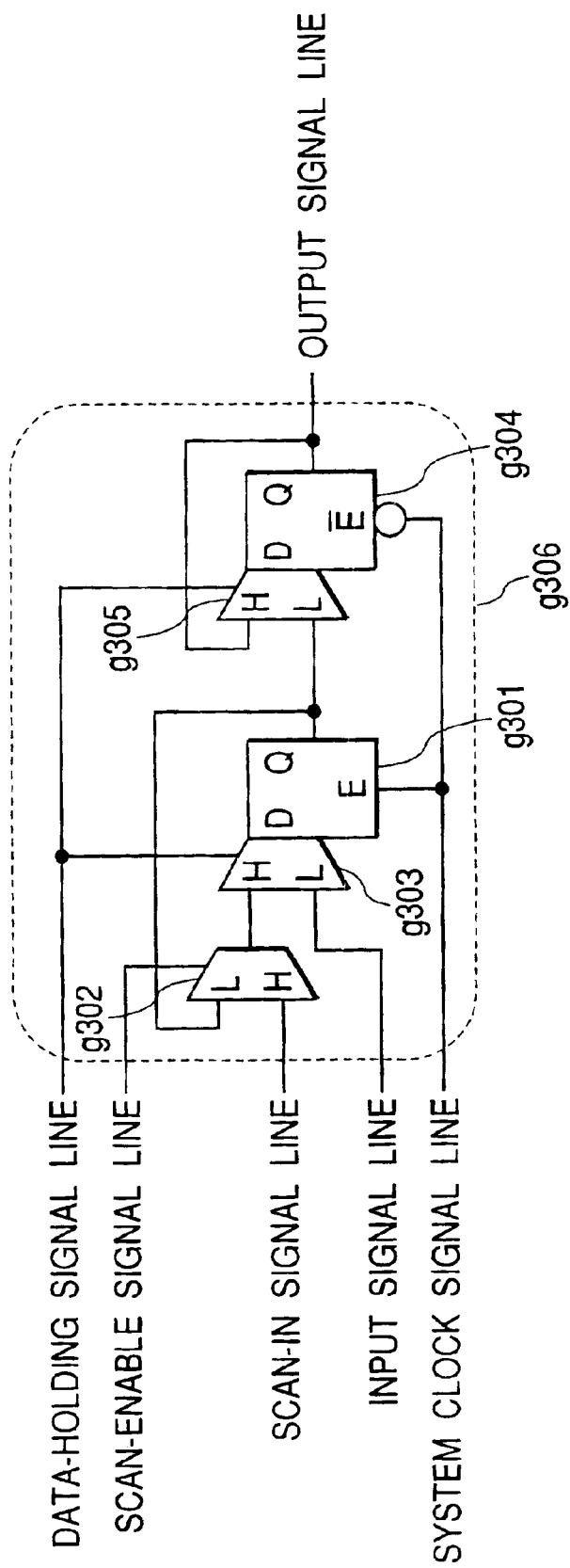
FIG. 1 illustrates the circuit structure of a semiconductor integrated circuit device according to a first embodiment of the present invention.

FIG. 1 illustrates the general structure of a semiconductor integrated circuit device according to a first exemplary embodiment of the present invention. This example applies the present invention to a conventional MUX-type scan FF. In this configuration, a selector is inserted before each latch constituting a conventional scan FF (g1704).

Specifically, a scan-in signal line is connected with a selector g302 which, under the control of a scan-enable signal line, selects whether to output a scan-in signal or the output signal of a master latch g301 constituting a scan FF.

Also, input terminal D of g301 is connected to a selector g303 which, under the control of a data-holding signal line, selects whether to output the input signal from the logic circuit or the output signal of g302. Further, input terminal D of a slave latch g304 constituting the scan FF is connected with a selector g305 which, under the control of the data-holding signal line, selects whether to output an output signal of g301 or an output signal of g304.

Figure 2:
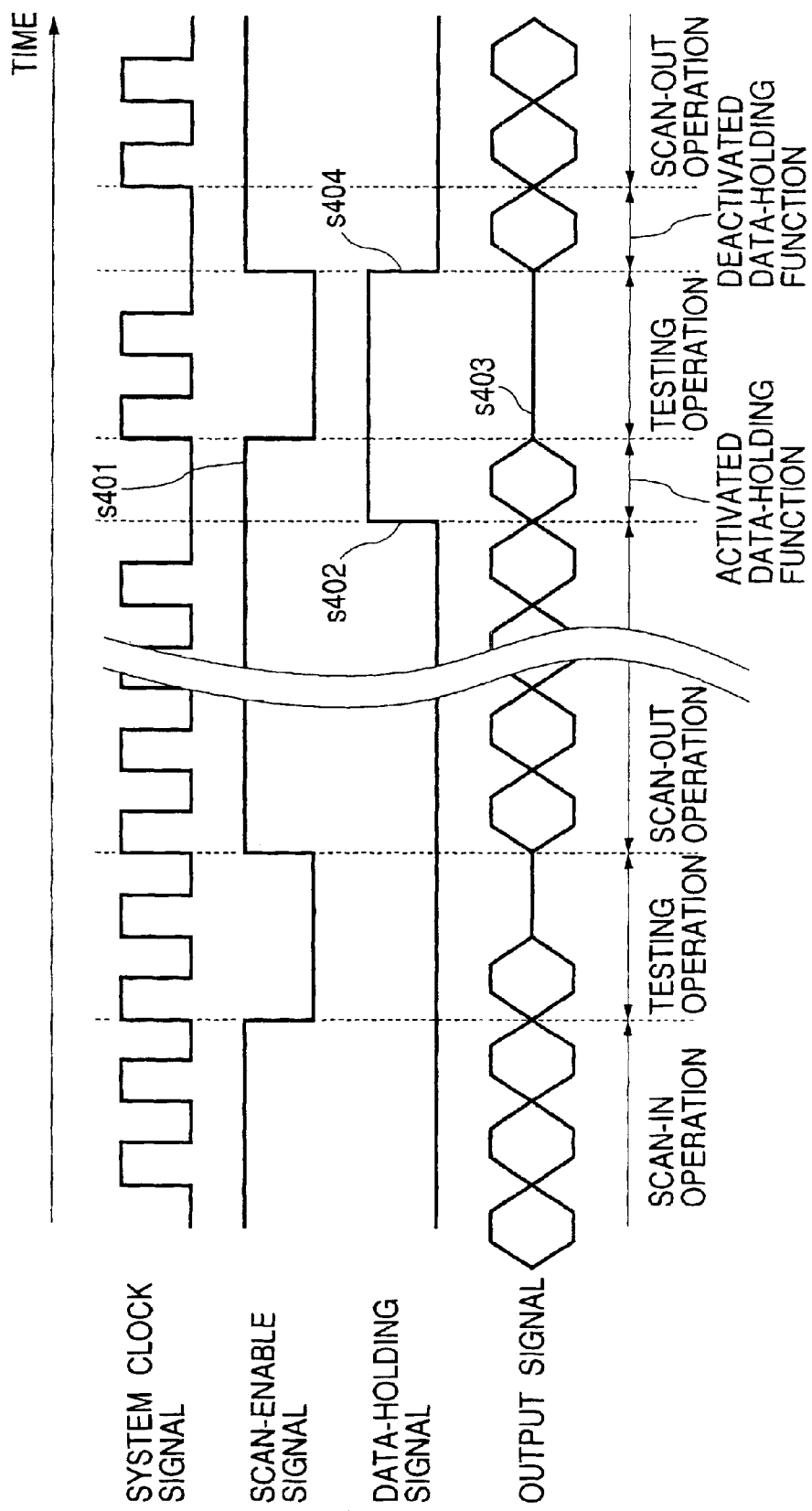
FIG. 2 is a timing diagram showing the operation according to the first embodiment.

FIG. 2 is a timing diagram showing the operation of the first embodiment. Initially, prior to the testing operation, the data-holding function incorporated in the scan FF g306 according to the present invention is activated. Meanwhile, the clock signal is stopped (s401) and the state of the data-holding signal is changed from Low to High (s402) so that even when there is a transition of the clock signal, the output signals of g301 and g304 can be held (s403).

Completion of the above-mentioned signal control requires a waiting time which corresponds to a signal propagation delay equivalent to one gate stage. However, the resultant increase in the overall test time which is caused by this waiting time is negligible. In general, the number of clock signal transitions necessary for the scan operation is hundreds to thousands of times as large as that for the testing operation, and the time required for the scan operation accounts for most of the test time. Also, the clock and data-holding signals can be easily generated using conventional techniques. Specifically, such signals can be fed from outside of the chip using a tester or using an oscillation circuit with an added counter inside the chip.

After completion of the testing operation, the data-holding function is deactivated. Meanwhile, the clock signal is stopped, and the state of the data-holding signal is changed from High to Low (s404) so that the holding condition of the output signals of g301 and g304 is cancelled. With the data-holding signal in the Low state, the testing operation is carried out in the same way as in a conventional scan FF.

Figure 3:
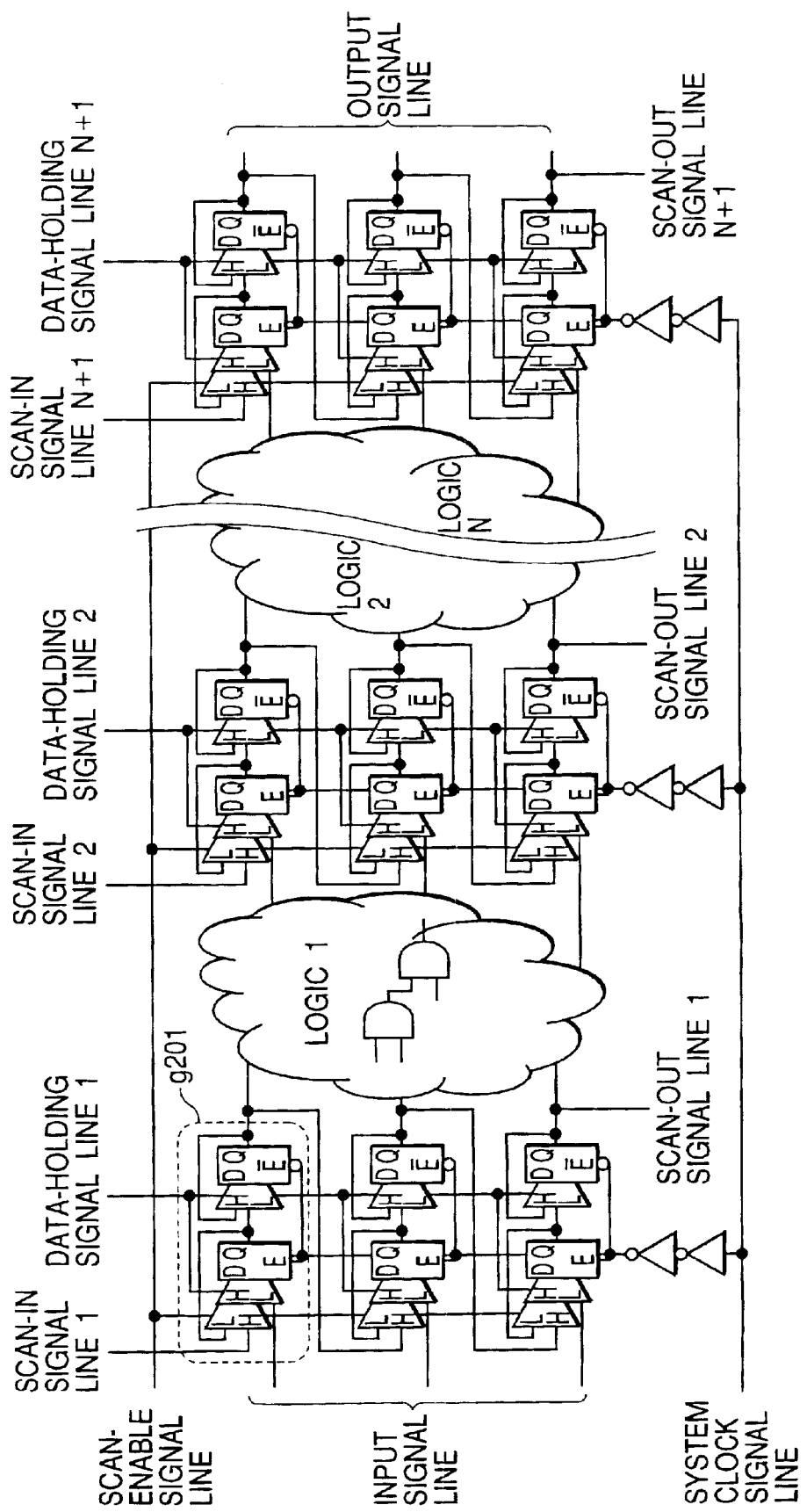
FIG. 3 illustrates the circuit structure of a semiconductor integrated circuit device as an application example according to the first embodiment.

FIG. 3 illustrates the circuit structure of a semiconductor integrated circuit device as an application example according to the first embodiment.

In this example, the logic circuit is divided into N logic blocks (circuit blocks) using N+1 scan paths comprised of scan FFs (g201) described in connection with the first exemplary embodiment.

Figure 4:
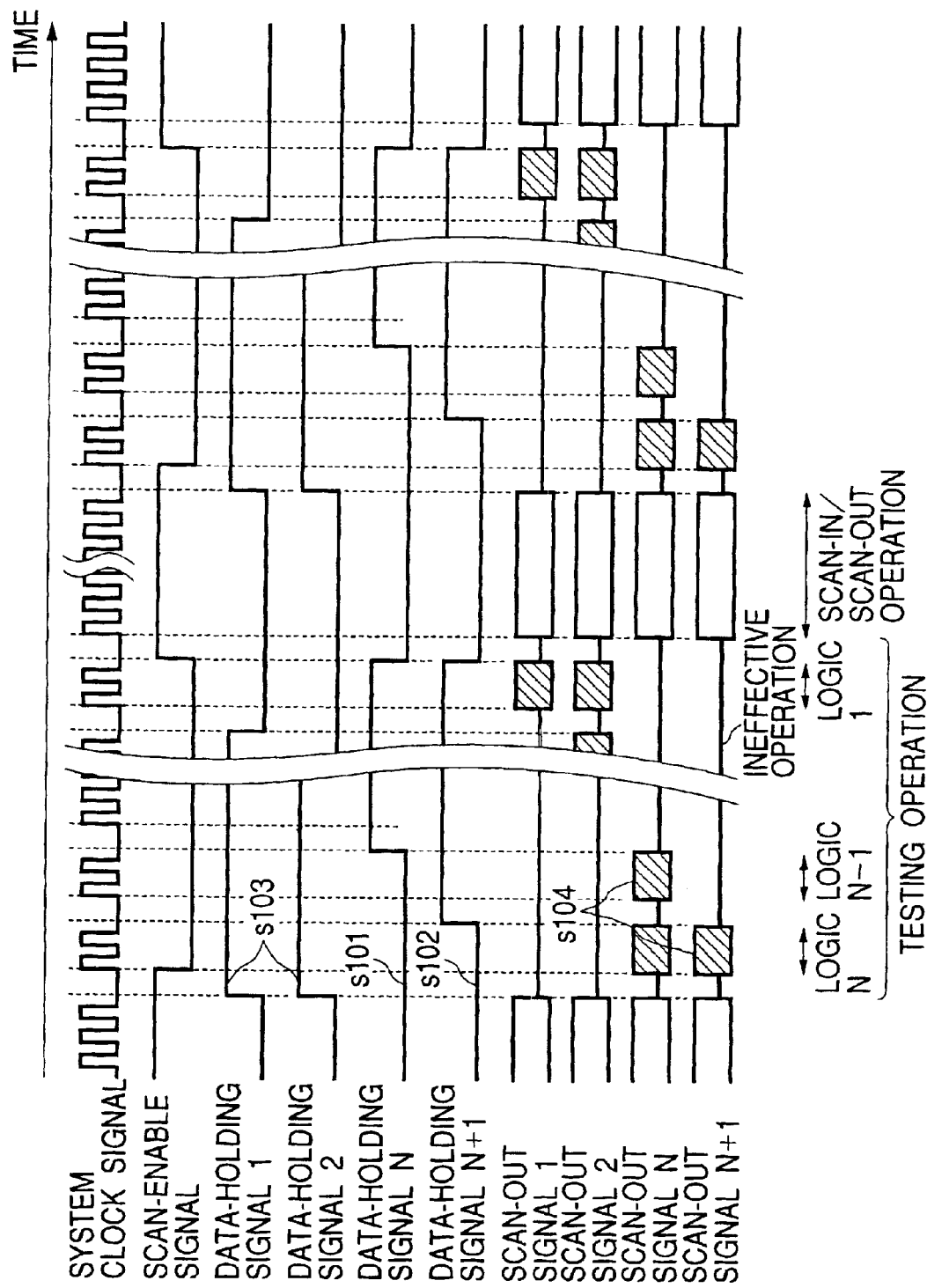
FIG. 4 is a timing diagram showing how the semiconductor integrated circuit device shown in FIG. 3 operates.

FIG. 4 is a timing diagram showing how the semiconductor integrated circuit device shown in FIG. 3 operates. The testing operation takes place in the order of proximity to the output of the whole logic circuit, namely from Logic N to Logic 1. Initially, before the testing operation for Logic N, data-holding signal N is set at Low (s101) so that the initial value for the test as supplied from scan-in signal line N can be input for Logic N. Data-holding signal N+1 is set at Low (s102) so that the scan FF connected to scan-in signal line N+1 can collect the result data for the test of Logic N. Further, in order to pause Logic 1 to Logic N−1, data-holding signal 1 to data-holding signal N−1 are set at High (s103).

Thereafter, in the testing operation for Logic N, the result data for the test of Logic N is stored in the scan FF connected to scan-in signal line N+1. The result data for the test of Logic N remains held until data-holding signal N becomes Low again. After this, a similar operational sequence is followed for Logic N−1 through Logic 1. As described above, according to this configuration, a common scan operation is performed for Logic N to Logic 1 of the divided logic circuit and a testing operation can be continuously carried out on these logic blocks (s104).

Therefore, this configuration eliminates the overlaps of the scan operation that are seen in the conventional methods without causing fault-detecting errors due to excessive voltage drops or chip damage due to heat generation. Consequently, the overall test time may be shortened. Furthermore, since the testing operation begins with a logic block nearest to the output of the whole logic circuit, an increase in the chip area can be minimized. In other words, according to the first exemplary embodiment, only two additional selectors for holding data (g302 and g305) are used for the scan FF. However, if the order in which the testing operation takes place is not specified, the master latch (g301) and slave latch (g304) must be doubled.

Figure 5:
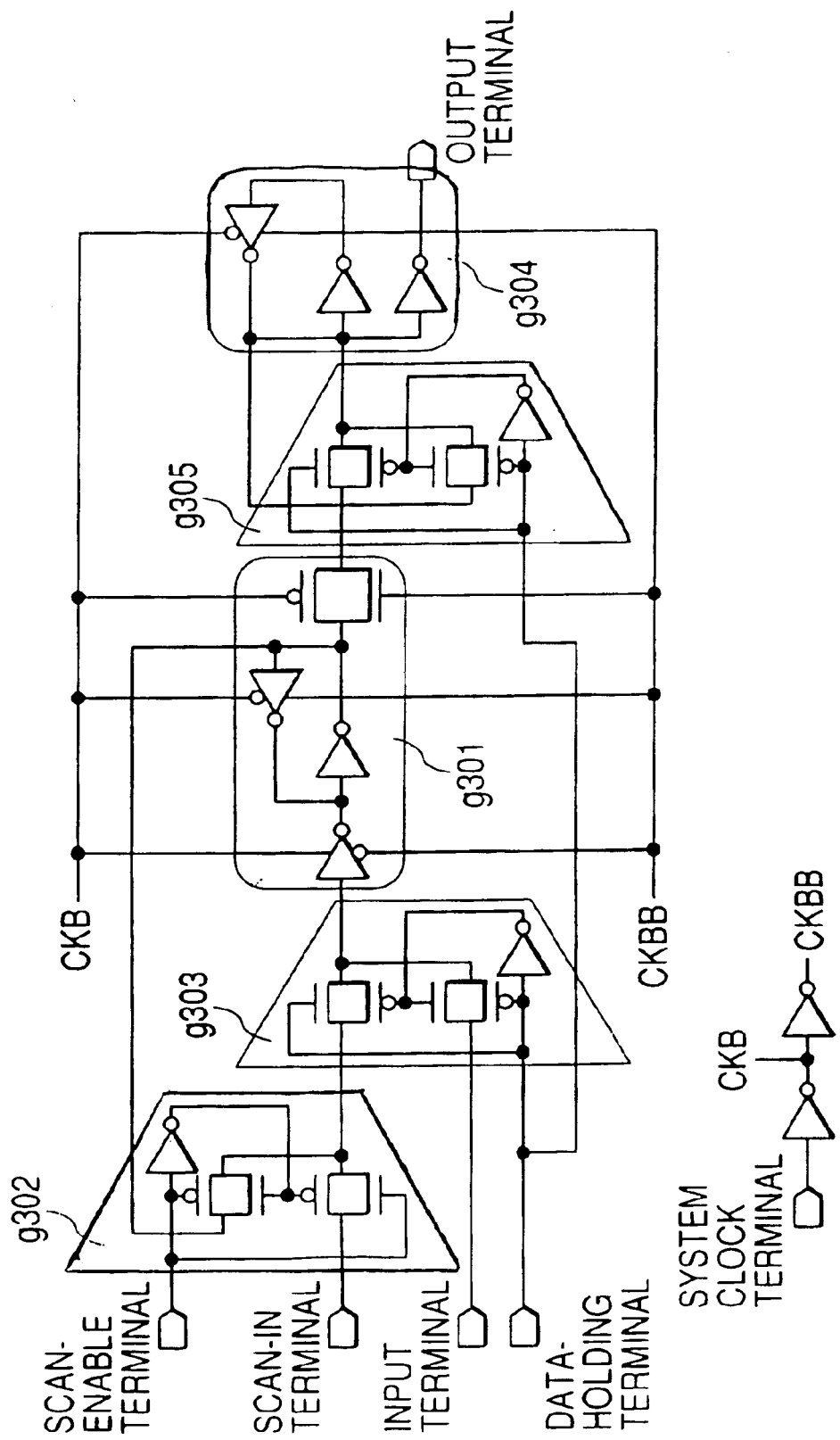
FIG. 5 is a circuit diagram showing an example of internal circuitry of a scan FF described in connection with the first embodiment.

FIG. 5 is a circuit diagram showing an example of the internal circuitry of the scan FF (g306) described in connection with the first exemplary embodiment. G301 to g305 in FIG. 5 correspond to those in FIG. 1.

Figure 6:
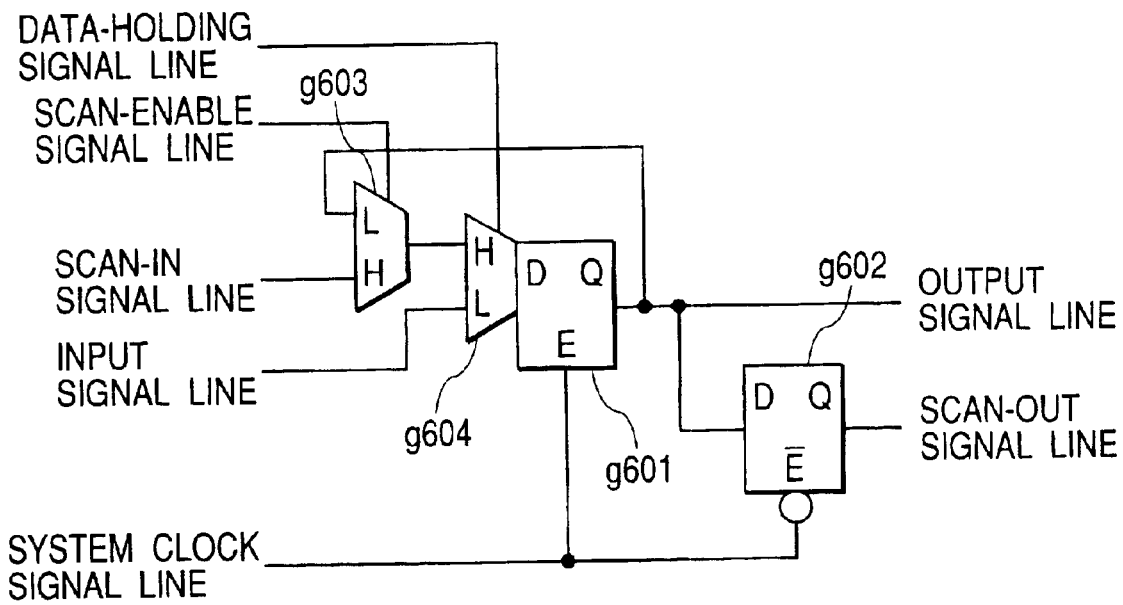
FIG. 6 illustrates the circuit structure of a semiconductor integrated circuit device according to a second embodiment of the present invention.

FIG. 6 illustrates the circuit structure of a semiconductor integrated circuit device according to a second exemplary embodiment of the present invention. This example applies the present invention to a MUX-type scan latch. The scan latch has a structure in which output terminal Q of a master latch g601 is connected to input terminal D of a slave latch g602 dedicated to scan.

The present invention can be applied not only to the scan FF but also to the scan latch as in the case of the first exemplary embodiment. Specifically, the scan-in signal line is connected with a selector g603 which, under the control of the scan-enable signal line, selects whether to output the scan-in signal or the output signal of g601. Further, input terminal D of g601 is connected with a selector g604 which, under the control of the data-holding signal line, selects whether to output the input signal from the logic circuit or the output signal of g603.

Figure 7:
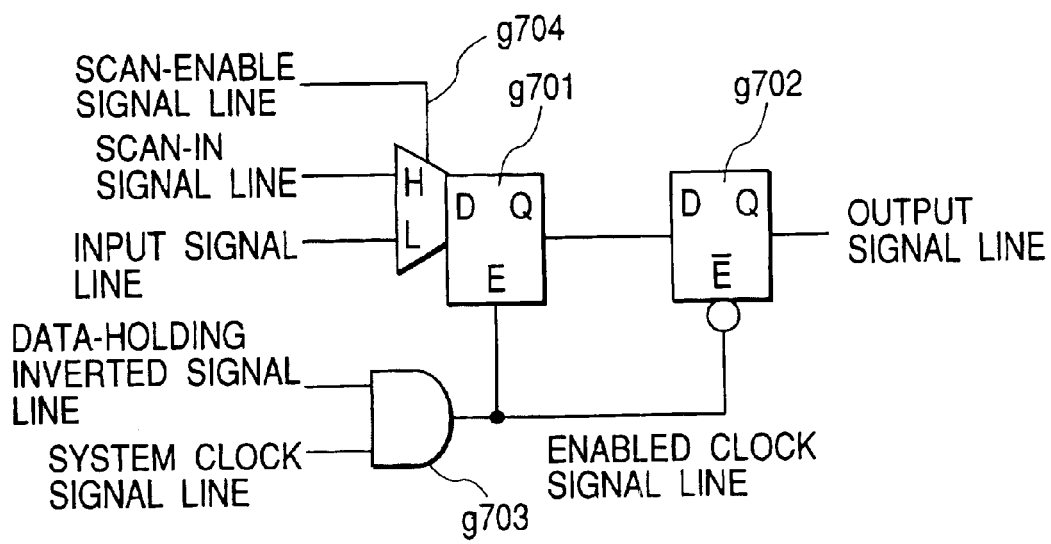
FIG. 7 illustrates the circuit structure of a semiconductor integrated circuit device according to a third embodiment of the present invention.

FIG. 7 illustrates the circuit structure of a semiconductor integrated circuit device according to a third exemplary embodiment of the present invention. This embodiment applies the present invention to a MUX-type scan FF. In this configuration, a two-input AND gate g703 which is controlled by a "data-holding inverted signal line" for the propagation of an inverted signal with respect to the data-holding signal is inserted in the scan FF's clock signal line.

This configuration provides a data-holding function similar to that of the first exemplary embodiment without the feedback of the output signal from the master latch to the selector as was needed in the first exemplary embodiment. Therefore, when the data-holding inverted signal is set at Low, the transition of the clock signal is prevented from being input to the master latch g701 and slave latch g702 which both comprise the scan FF.

Figure 8:
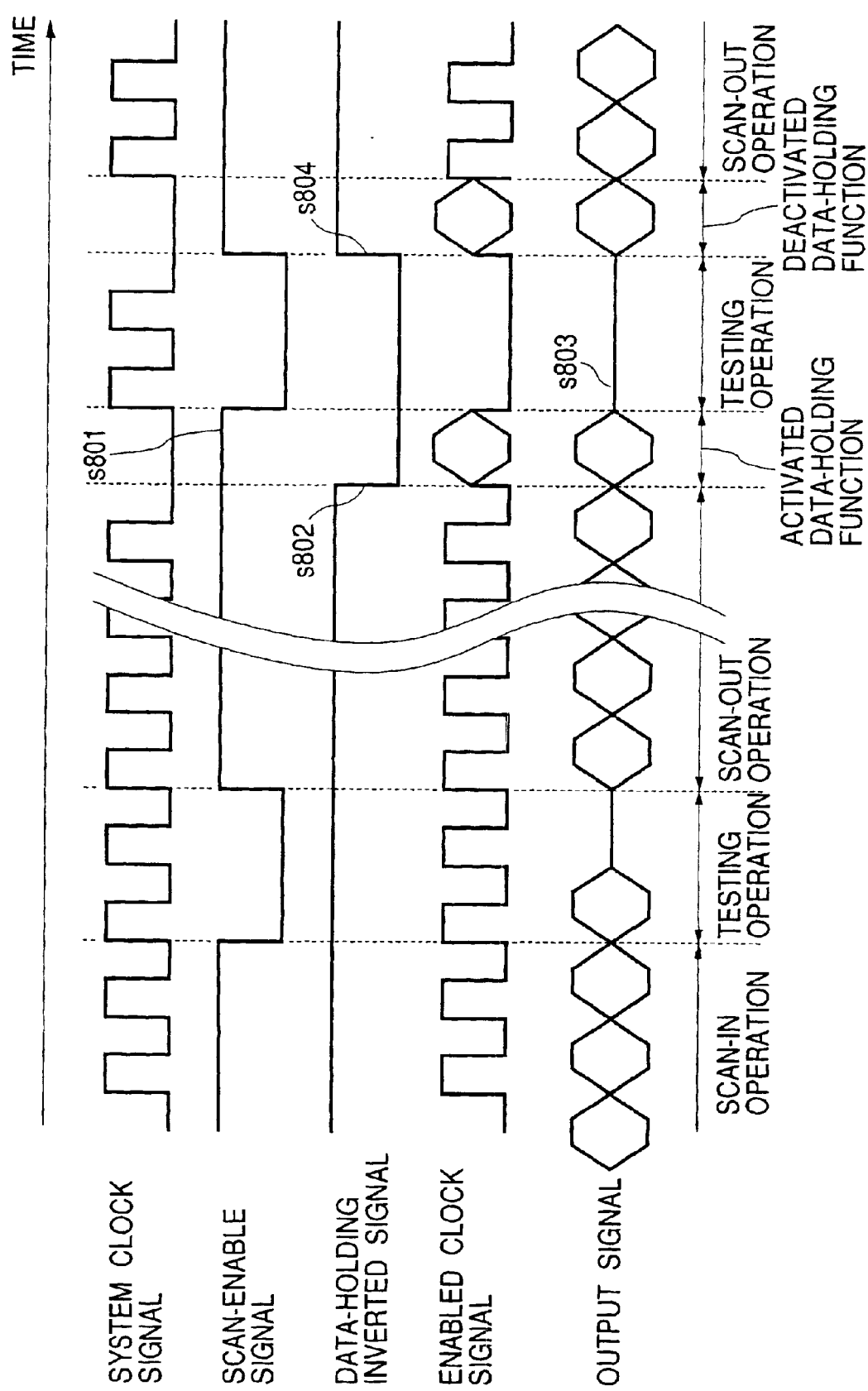
FIG. 8 is a timing diagram showing the operation according to the third embodiment.

FIG. 8 is a timing diagram showing the operation according to the third exemplary embodiment. Initially, prior to the testing operation, the data-holding function incorporated in the scan FF according to the present invention is activated. Meanwhile, the clock signal transition is stopped (s801) and the state of the data-holding inverted signal is changed from High to Low (s802) so that even when there is a transition of the clock signal, the output signals of g701 and g702 can be held (s803). Completion of the above-mentioned signal control requires a waiting time. However, an increase in the overall test time which is caused by this waiting time is negligible as in the case of the first exemplary embodiment.

Clock and scan-enable signals can be easily generated using conventional techniques. After completion of the testing operation, the data-holding function is deactivated. At the same time, the clock signal is stopped, and the state of the data-holding inverted signal is changed from Low to High (s804) so that the holding condition of the output signals of g701 and g702 is cancelled. With the data-holding signal in the Low state, the testing operation is carried out in the same way as in a conventional scan FF.

Figure 9:
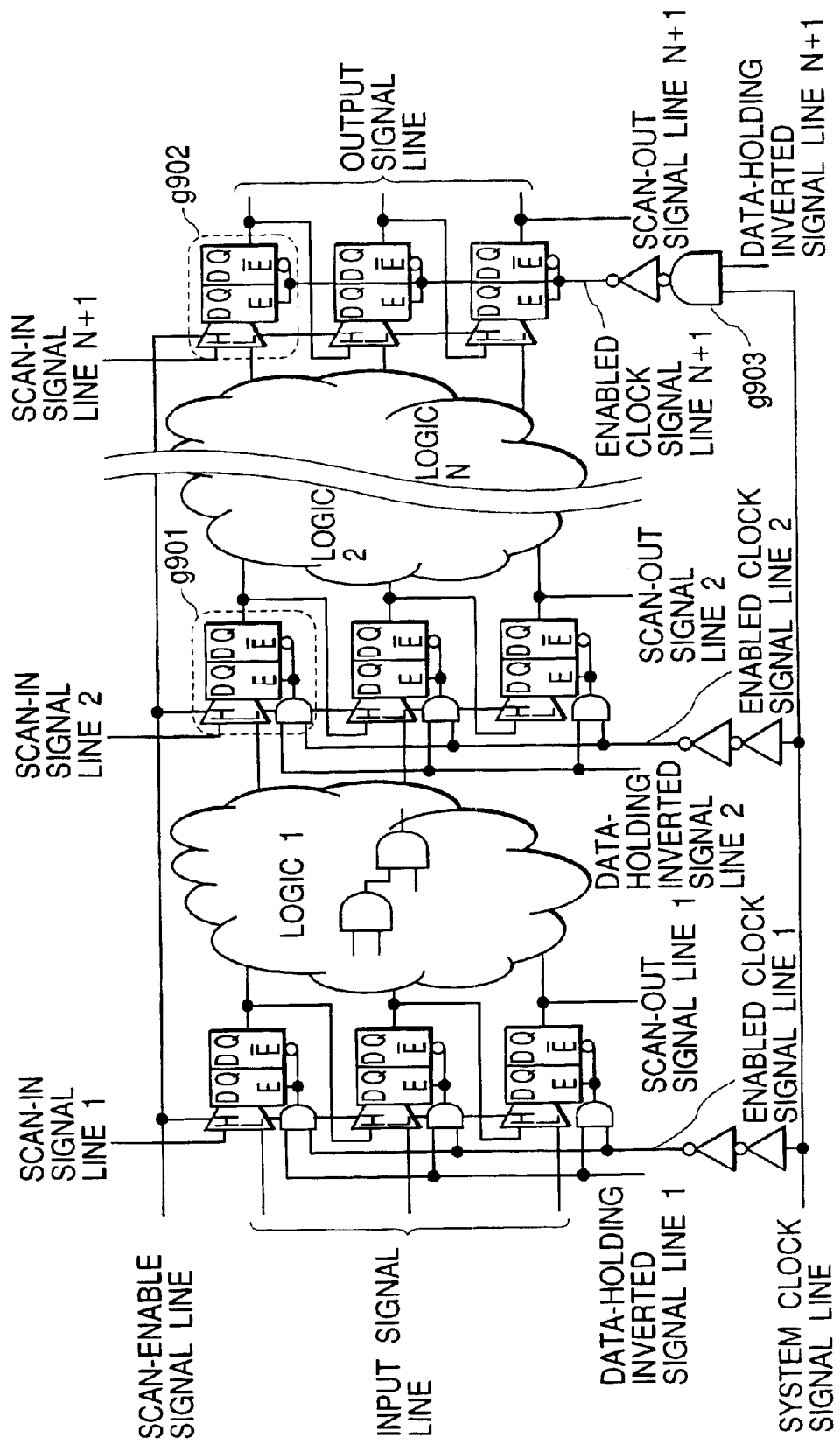
FIG. 9 illustrates the circuit structure of a semiconductor integrated circuit device as an application example according to the third embodiment.

FIG. 9 illustrates the structure of a semiconductor integrated circuit device as an application example according to the third exemplary embodiment. In this example, the logic circuit is divided into N logic blocks where scan FFs g901 described in connection with the third exemplary embodiment and conventional scan FFs g902 are mixed.

In this configuration, a two-input AND gate g903 which is controlled by a data-holding inverted signal line is inserted in the clock signal line connected with g902. This configuration enables g902 to provide a data-holding function similar to that of g901. In addition, the number of transistors which constitute a scan FF may be smaller than the third embodiment, which may lead to a smaller chip area and reduced power consumption.

Figure 10:
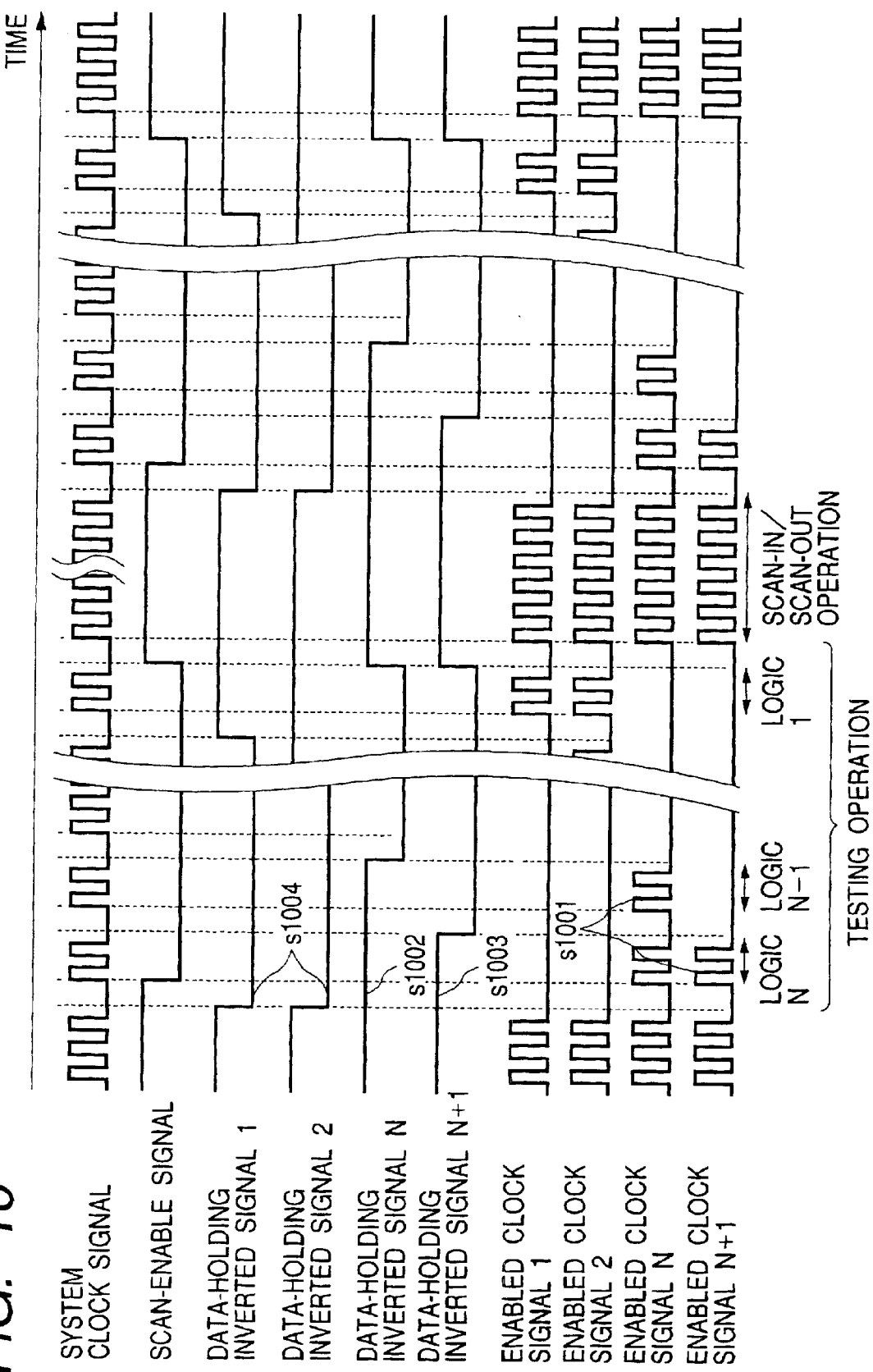
FIG. 10 is a timing diagram showing how the semiconductor integrated circuit device shown in FIG. 9 operates.

FIG. 10 is a timing diagram showing the operation of the semiconductor integrated circuit device shown in FIG. 9. In this example, a data-holding inverted signal is set to stop the clock signal transition. Therefore, as in the case shown in FIG. 3, common scan operation is carried out on Logic N to Logic 1 of the divided logic circuit, and a testing operation can be continuously carried out on the logic blocks (s1001).

Here, the testing operation takes place in the order of proximity to the output of the whole logic circuit, namely from Logic N to Logic 1. Initially, before the testing operation for Logic N, data-holding inverted signal N+1 is set at High (s1002) so that the initial value for the test as supplied from scan-in signal line N can be input for Logic N. Data-holding inverted signal N+1 is set at High (s1003) so that the scan FF connected to scan-in signal line N+1 can collect the result data for the test of Logic N. Further, in order to pause Logic 1 to Logic N−1, data-holding inverted signal 1 to data-holding inverted signal N−1 are set at Low (s1004).

Thereafter, in the testing operation for Logic N, the result data for the test of Logic N is stored in the scan FF connected with scan-in signal line N+1. The result data for the test of Logic N remains held until data-holding signal N becomes Low again. After this, a similar operational sequence is followed for Logic N−1 to Logic 1.

Figure 11:
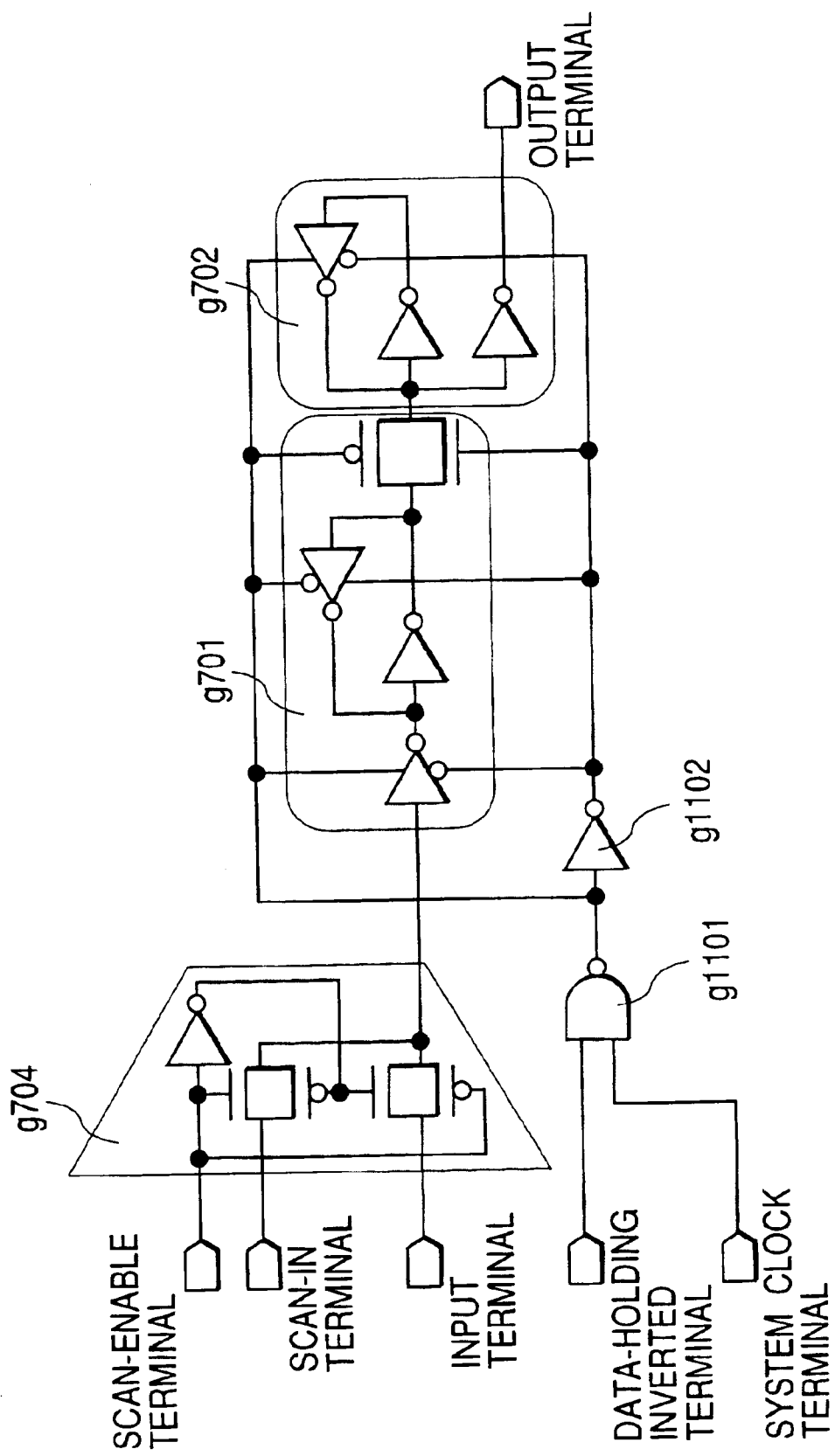
FIG. 11 illustrates the circuit structure of a semiconductor integrated circuit device according to a fourth embodiment of the present invention.

FIG. 11 illustrates the structure of a semiconductor integrated circuit device according to a fourth exemplary embodiment of the present invention. In this example, a clock gate (g903) as described in connection with the third exemplary embodiment is incorporated in a MUX-type scan FF.

In this configuration, a two-input NAND gate g1101 which is controlled by a data-holding inverted signal line is inserted after a system clock terminal. This configuration permits a reduction in the number of gate stages provided on the clock signal line as compared with the third exemplary embodiment. In other words, while the third exemplary embodiment uses three gate stages (g903, g2001, and g2002), this embodiment uses only two gate stages g1101, g1102.

In addition, the size of a transistor which comprises a scan FF may be smaller than in the third exemplary embodiment, which could lead to a smaller chip area and reduced power consumption. Since there are two gate stages on the clock signal line as in the conventional type of scan FF, the scan FFs according to the present invention and the conventional type of scan FFs may be mixed, thereby preventing an increase in clock skews.

Figure 12:
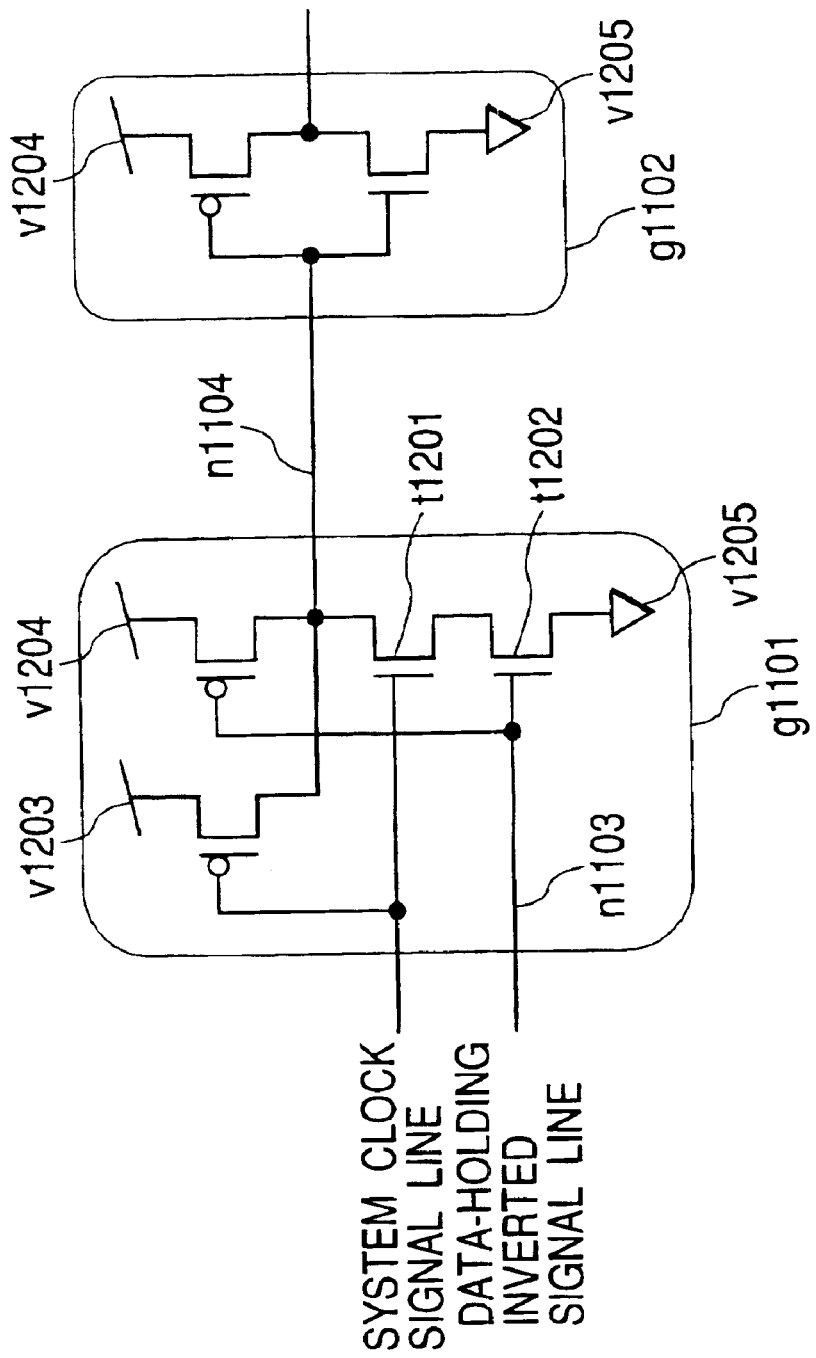
FIG. 12 is a circuit diagram showing an example of the internal circuitry of a semiconductor integrated circuit device according to the fourth embodiment.

FIG. 12 is a circuit diagram showing an example of the internal circuitry of a semiconductor integrated circuit device according to the fourth exemplary embodiment. In this example, the clock gate g1101 and inverter gate g1102 as described in connection with the fourth exemplary embodiment are comprised of transistors.

In this configuration, the clock signal line is connected to the gate terminal of transistor t1201 (comprising g1101) whose drain terminal is connected with the output terminal of g1101. In this configuration, the delay time in clock signal propagation is shorter than when the clock signal line is connected with the gate terminal of transistor t1202 whose drain terminal is not connected with the output terminal of g1101.

Figure 13:
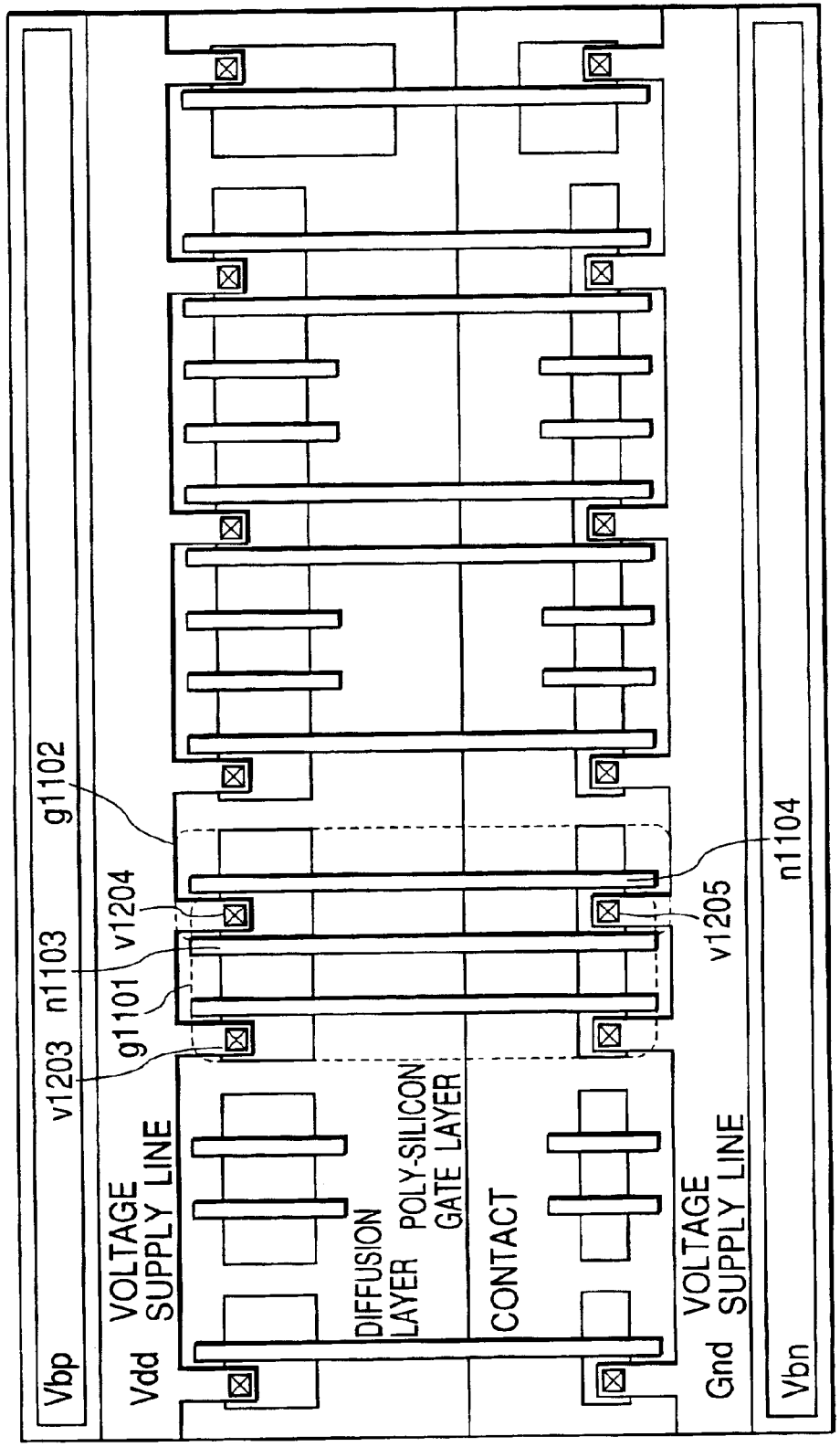
FIG. 13 is a top view showing an exemplary layout of scan FFs described in connection with the fourth embodiment.

FIG. 13 is a top view showing an example of the layout of scan FFs described in connection with the fourth exemplary embodiment. For better illustration, voltage supply lines, diffusion layers, and poly-silicon gate layers are shown, but connection lines between poly-silicon gate layers and diffusion layers are omitted.

In this configuration, g1101 and g1102 share Vdd voltage supply line v1203 and Gnd voltage supply line v1205. This makes it possible to decrease the width of diffusion layers, resulting in chip area reduction.

Figure 14:
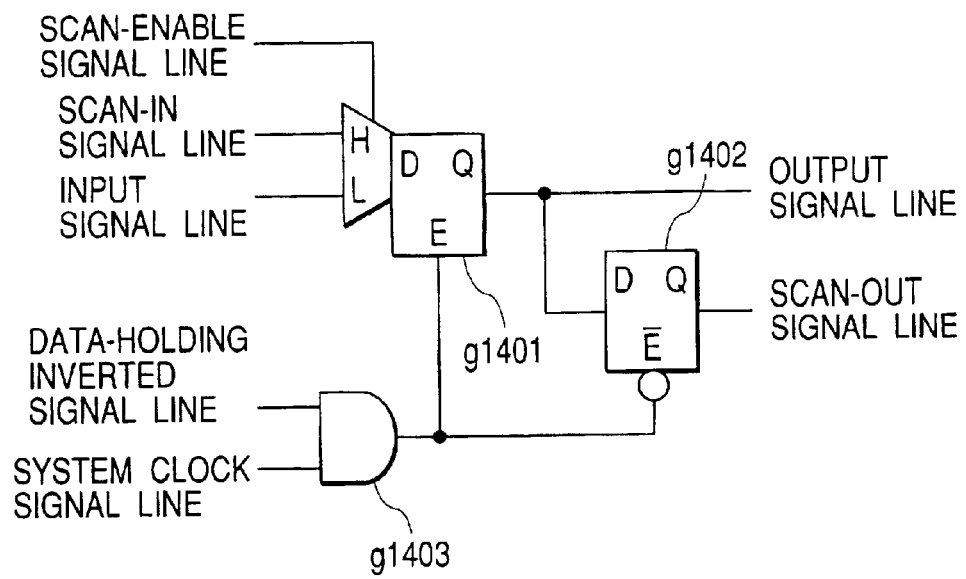
FIG. 14 illustrates the circuit structure of a semiconductor integrated circuit device according to a fifth embodiment of the present invention.

FIG. 14 illustrates the structure of a semiconductor integrated circuit device according to a fifth exemplary embodiment of the present invention. This example applies the present invention to a MUX-type scan latch. The scan latch has a structure in which output terminal Q of a master latch g1401 is connected with input terminal D of a slave latch g1402 dedicated to scan.

The present invention may be applied not only to a scan FF but also to a scan latch as in the case of the third exemplary embodiment. Specifically, a two-input AND gate g1403, which is controlled by the data-holding inverted signal line, is inserted in the clock signal line. The output signal line of g1403 is connected to the clock terminal of g1401, and the clock signal line is connected to the clock terminal of g1402.

Figure 15:
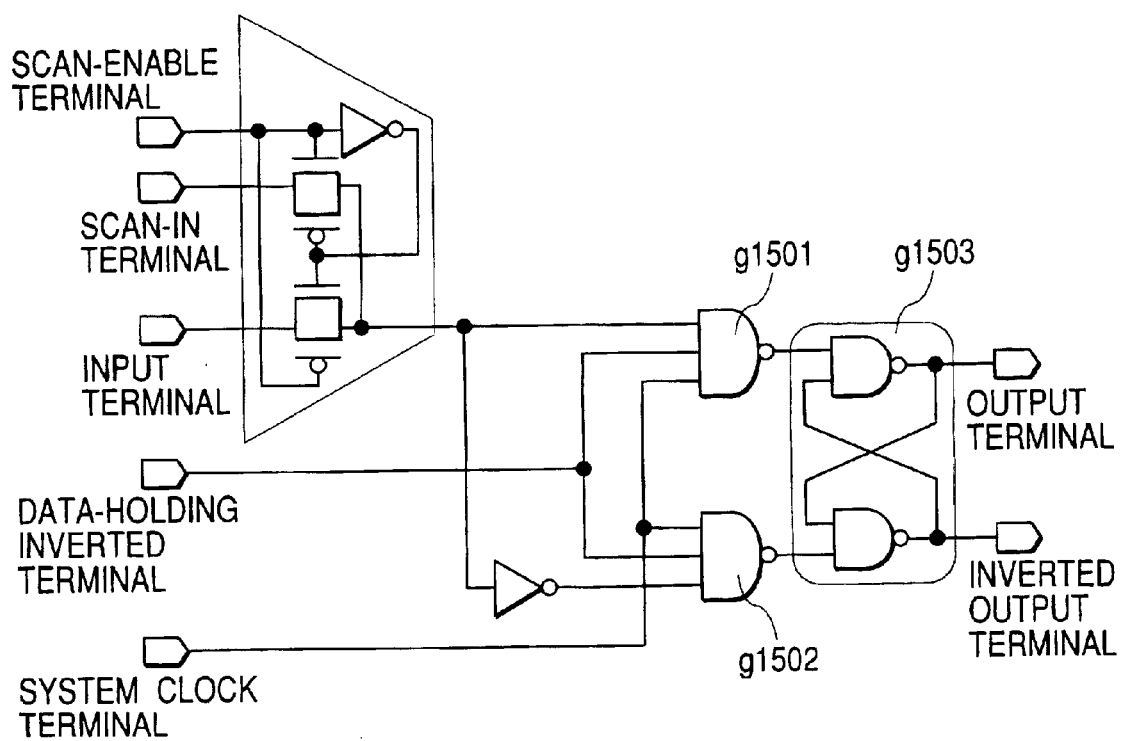
FIG. 15 illustrates the circuit structure of a semiconductor integrated circuit device according to a sixth embodiment of the present invention.

FIG. 15 illustrates the structure of a semiconductor integrated circuit device according to a sixth exemplary embodiment of the present invention. In this example, the clock gate (g1403) as described in connection with the fifth exemplary embodiment is built in the master latch (g1401) of a MUX-type scan latch (g1401).

As in the fourth exemplary embodiment, the present invention may be applied even when the clock signal of the master latch is driven by NAND gates (g1501 and g1502) rather than an inverter gate. Specifically, this may be achieved using three-input NAND gates as g1501 and g1502 instead of two-input NAND gates and connecting data-holding inverted terminals to the respective gates.

Figure 16:
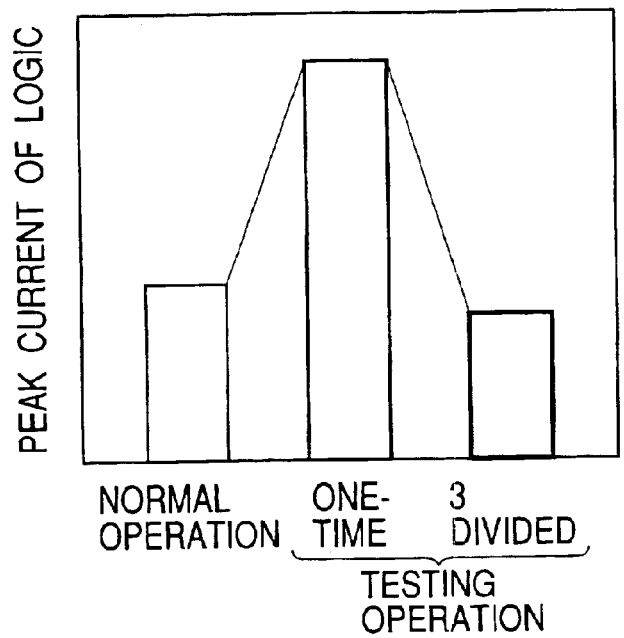
FIG. 16 is a graph showing peak current values in the testing operation concerning the fourth embodiment.
Figure 17:
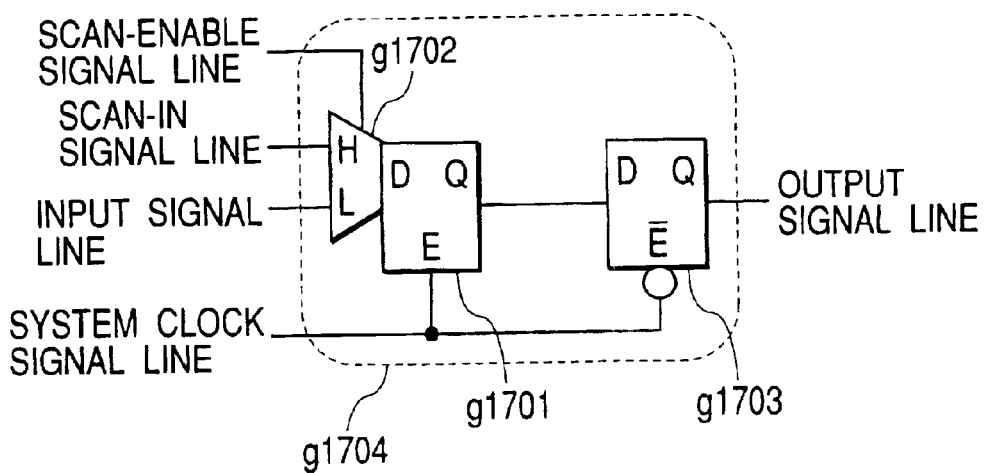
FIG. 17 shows the circuit structure of a conventional scan FF.
Figure 18:
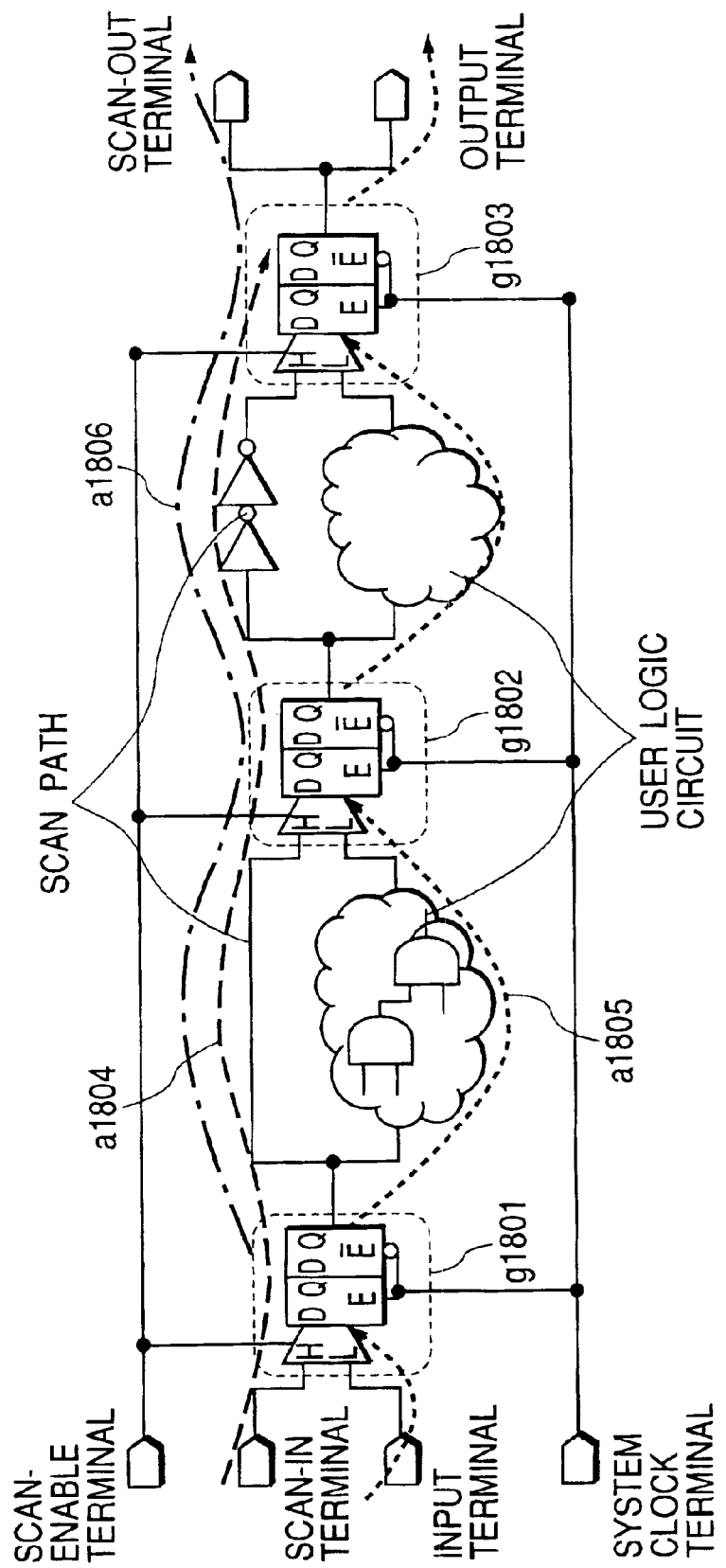
FIG. 18 shows a logic circuit scanned by conventional methods.
Figure 19:
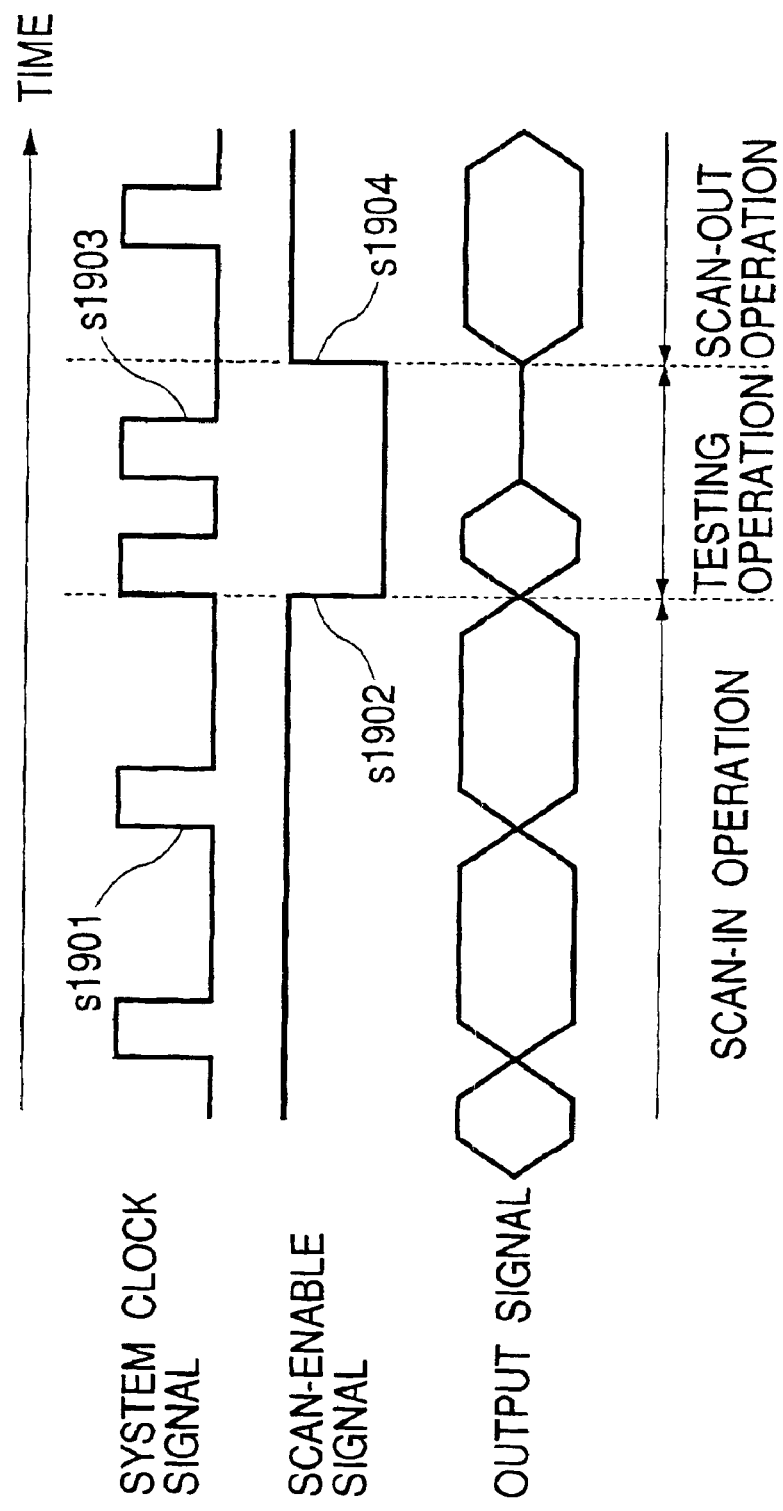
FIG. 19 is a timing diagram showing the operation of a conventional scan FF.
Figure 20:
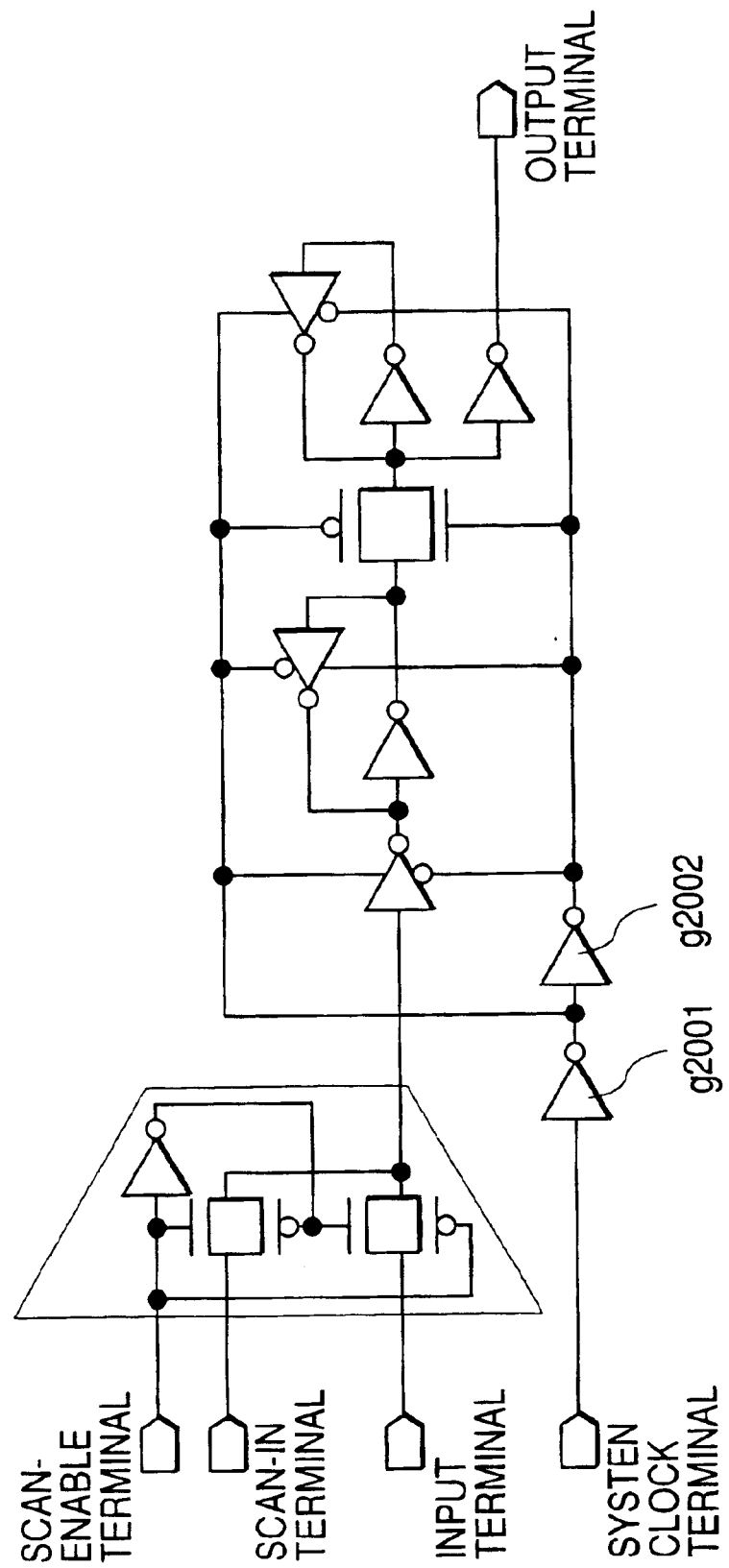
FIG. 20 shows the structure of internal circuitry of a conventional scan FF.
Figure 21:
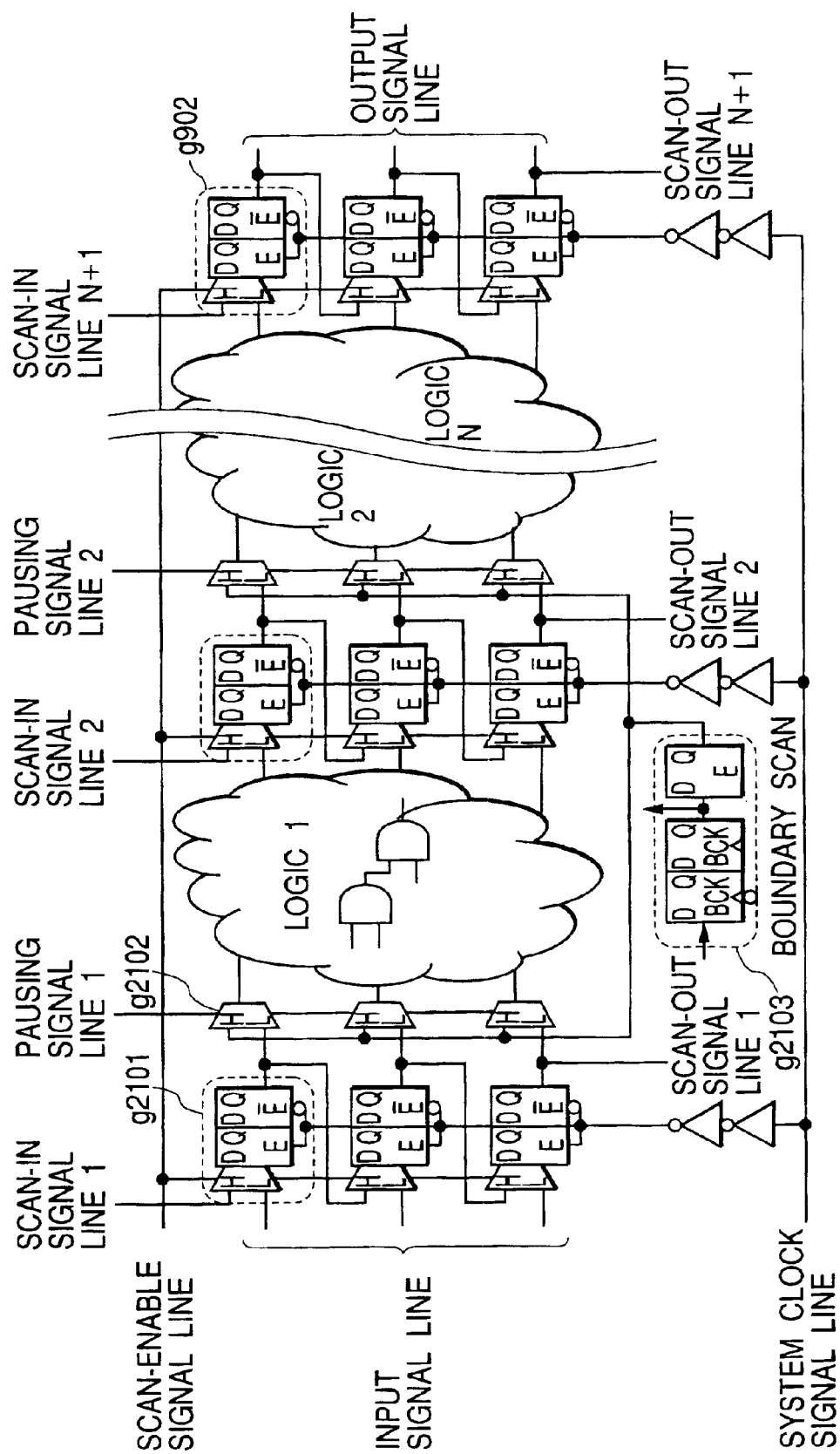
FIG. 21 shows a logic circuit as divided by conventional methods.

FIG. 16 is a graph showing peak current values in the testing operation concerning the fourth exemplary embodiment. When the whole logic circuit is tested at one time, the peak values of currents consumed by the logic circuit during the testing operation are at least twice as high as those during normal operation. In order to lower the peak current values in testing operation, the logic circuit should be divided. According to the present invention, it is divided into three blocks.

Accordingly, when the technique suggested by the present invention is used, the test time can be reduced to one half or less of that required using conventional techniques. As explained above, the present invention may also reduce the test cost by making the test time shorter than in the conventional art.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor integrated circuit device, including storage elements and logic gates which constitute a scan flip-flop, said device comprising:

a first storage element having inputs and an output; a first logic gate having inputs and an output, wherein the inputs to said first logic gate include a first signal, the output signal of the first storage element, and a second signal;

a second logic gate having inputs and an output, wherein the inputs to said second logic gate include the output signal of the first logic gate, a third signal, and a fourth signal, wherein the output signal of the second logic gate and a fifth signal are input into the first storage element;

a second storage element having inputs and an output; and a third logic sate having inputs and an output, wherein the inputs to said third logic gate include the output signal of the first storage element, the output signal of the second storage element, and the fourth signal, further wherein the inputs of said second storage element include the output signal of the third logic gate and the fifth signal.

2. The semiconductor integrated circuit element of claim 1, further comprising:

a second storage device having inputs and an output, wherein the inputs of said second storage element include the output signal of the first storage element and the fifth signal.

3. The semiconductor integrated circuit device of claim 1, wherein said first logic gate comprises a first selector for selecting, through the first signal, whether to pick up the output signal of the first storage element or the second signal, and further wherein the second logic gate comprises a second selector for selecting, through the fourth signal, whether to pick up the output signal of the first logic gate or the third signal.

4. The semiconductor integrated circuit device of claim 2, wherein said first logic gate comprises a first selector for selecting, through the first signal, whether to pick up the output signal of the first, storage element or the second signal, and further wherein the second logic gate comprises a second selector for selecting, through the fourth signal, whether to pick up the output signal of the first logic gate or the third signal.

5. The semiconductor integrated circuit device of claim 1, wherein the third logic gate comprises a third selector for selecting, through the fourth signal, whether to pick up the output signal of the first storage element or the output signal of the second storage element.

* * * * *